(12) United States Patent
Miura

(10) Patent No.: US 11,171,169 B2
(45) Date of Patent: Nov. 9, 2021

(54) IMAGE SENSOR, IMAGING DEVICE AND IMAGING METHOD

(71) Applicant: Olympus Corporation, Hachioji (JP)

(72) Inventor: Toshimasa Miura, Machida (JP)

(73) Assignee: Olympus Corporation, Tokyo (JP)

( * ) Notice: Subject to any disclaimer, the term of this patent is extended or adjusted under 35 U.S.C. 154(b) by 106 days.

(21) Appl. No.: 16/691,432

(22) Filed: Nov. 21, 2019

(65) Prior Publication Data

US 2020/0194484 A1 Jun. 18, 2020

(30) Foreign Application Priority Data

Dec. 17, 2018 (JP) .............................. JP2018-235610

(51) Int. Cl.
*H01L 27/146* (2006.01)
*H04N 5/378* (2011.01)
*H04N 5/369* (2011.01)

(52) U.S. Cl.
CPC .. *H01L 27/14627* (2013.01); *H01L 27/14621* (2013.01); *H04N 5/36961* (2018.08); *H04N 5/378* (2013.01)

(58) Field of Classification Search
CPC ........ H01L 27/14627; H01L 27/14621; H04N 5/36961; H04N 5/378
See application file for complete search history.

(56) References Cited

U.S. PATENT DOCUMENTS

2019/0182431 A1* 6/2019 Kikuchi ........... H04N 5/232122

FOREIGN PATENT DOCUMENTS

JP 2015-049283 A 3/2015

* cited by examiner

*Primary Examiner* — Twyler L Haskins
*Assistant Examiner* — Fayeza A Bhuiyan
(74) *Attorney, Agent, or Firm* — John C. Pokotylo; Pokotylo Patent Services

(57) ABSTRACT

An image sensor, comprising pixels that have paired first pixel sections and second pixel sections, and a pixel signal generation circuit that repeatedly outputs an pixel signal, wherein the pixel signal generation circuit in a first frame among image frames, adds pixel signals of the first pixel sections corresponding to a first column to generate a first pixel addition signal, adds pixel signals of the second pixel sections corresponding to a second column to generate a second pixel addition signal, and respectively outputs the first and second pixel addition signals, and in a second frame that is continuous to the first frame, adds outputs of the second pixel section corresponding to the first column to generate a third pixel addition signal, adds outputs of the first pixel section corresponding to the second column to generate a fourth pixel addition signal, and respectively outputs the third and fourth pixel addition signals.

20 Claims, 14 Drawing Sheets

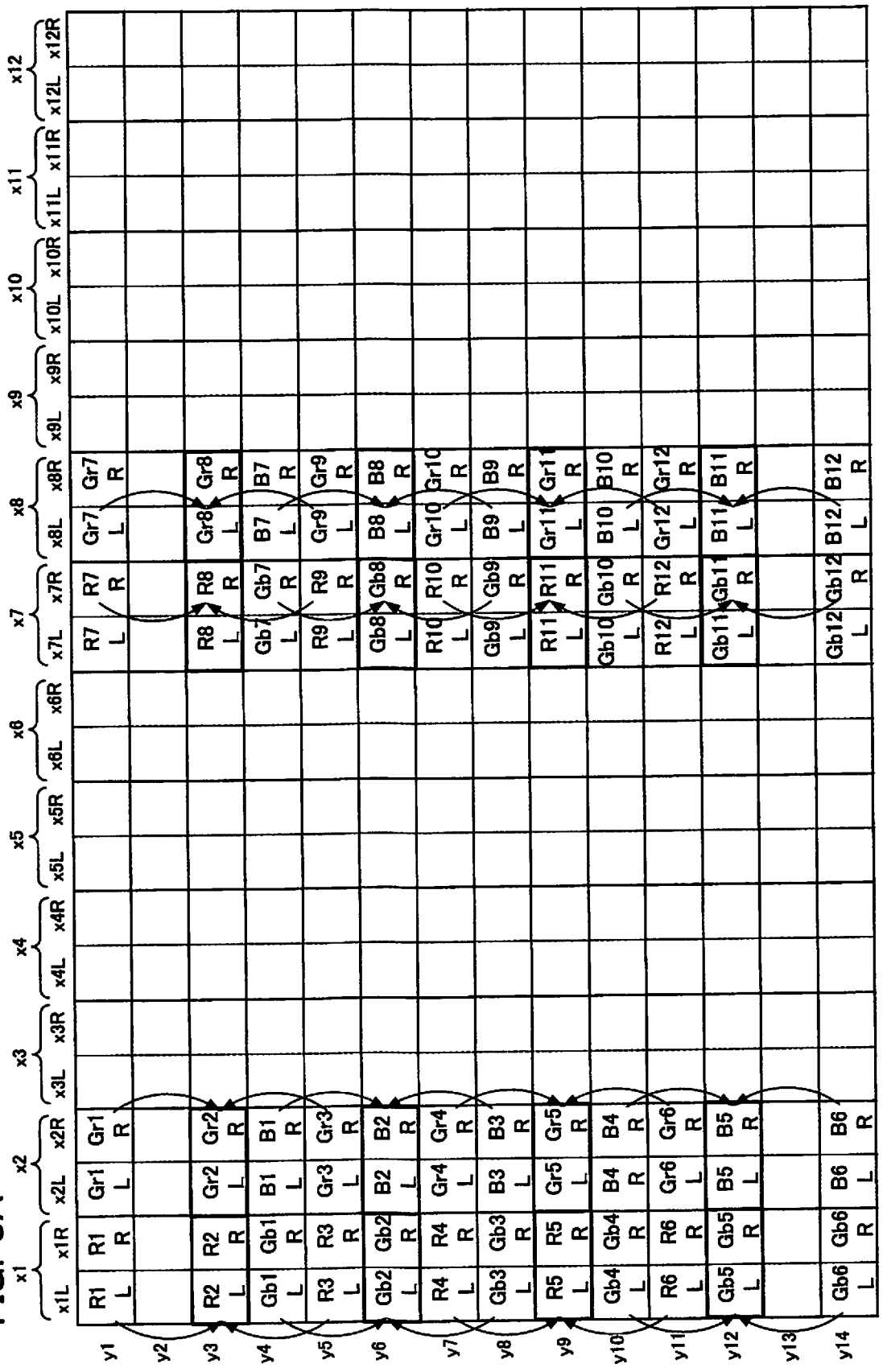

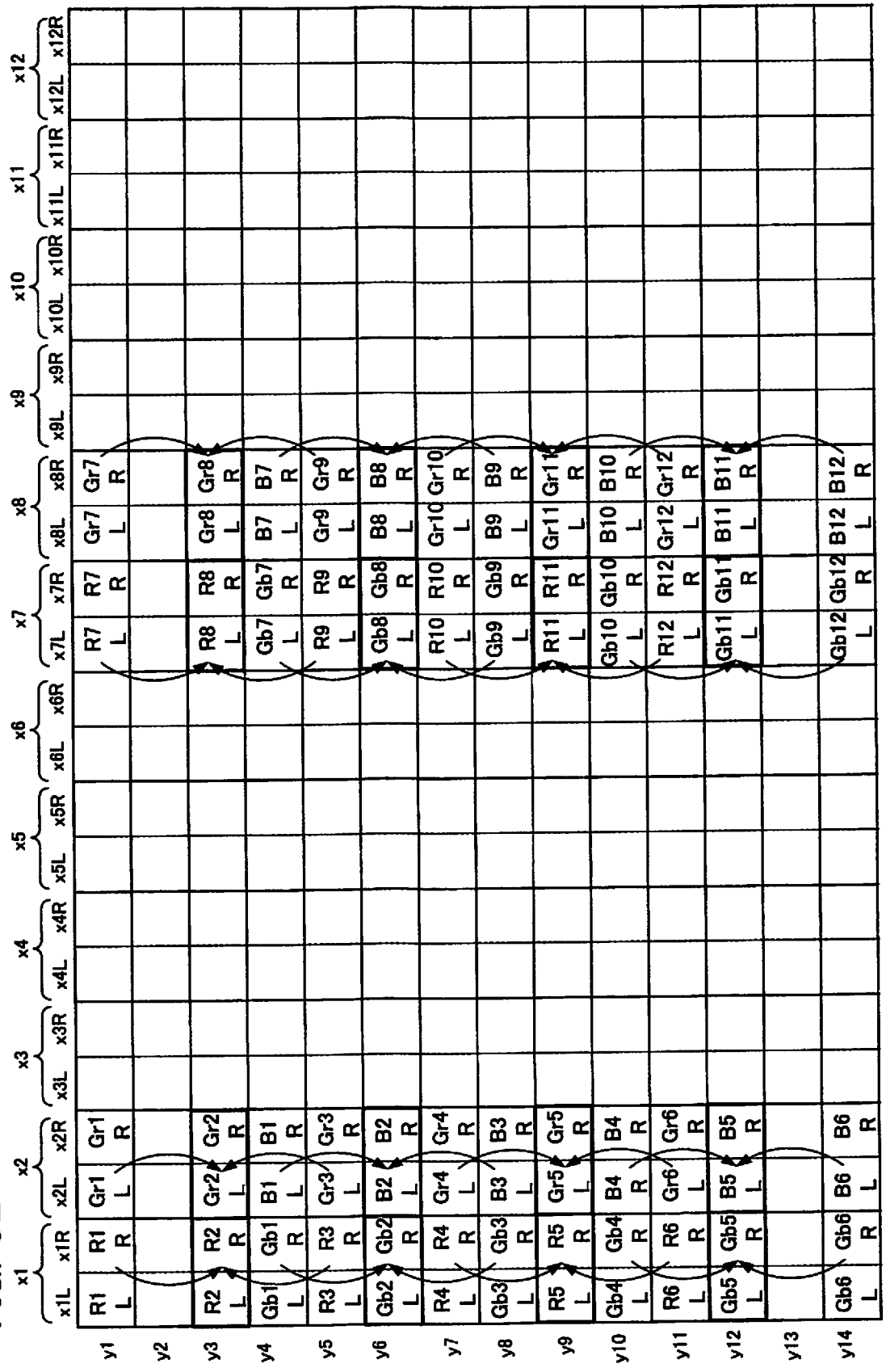

FIG. 6

ODD-NUMBERED FRAMES

|  | x1L | x2R | x7R | x8L |
|---|---|---|---|---|
| y3 | R'1L | Gr'1R | R'3R | Gr'3L |
| y6 | Gb'1L | B'1R | Gb'3R | B'3L |
| y9 | R'2L | Gr'2R | R'4R | Gr'4L |
| y12 | Gb'2L | B'2R | Gb'4R | B'4L |

EVEN-NUMBERED FRAMES

|  | x1R | x2L | x7L | x8R |
|---|---|---|---|---|
|  | R'1R | Gr'1L | R'3L | Gr'3R |
|  | Gb'1R | B'1L | Gb'3L | B'3R |
|  | R'2R | Gr'2L | R'4L | Gr'4R |
|  | Gb'2R | B'2L | Gb'4L | B'4R |

FIG. 7

ODD-NUMBERED FRAMES

| | x1L, x1R | x2L, x2R | x7R, x7L | x8R, x8L |
|---|---|---|---|---|
| y3 | R'1L | Gr'1L | R'3R | Gr'3R |
| y6 | Gb'1R | B'1R | Gb'3L | B'3L |
| y9 | R'2L | Gr'2L | R'4R | Gr'4R |
| y12 | Gb'2R | B'2R | Gb'4L | B'4L |

EVEN-NUMBERED FRAMES

| x1R, x1L | x2R, x2L | x7L, x7R | x8L, x8R |
|---|---|---|---|
| R'1R | Gr'1R | R'3L | Gr'3L |
| Gb'1L | B'1L | Gb'3R | B'3R |
| R'2R | Gr'2R | R'4L | Gr'4L |
| Gb'2L | B'2L | Gb'4R | B'4R |

FIG. 8

ODD-NUMBERED FRAMES

| | x1R, x1L | x2R, x2L | x7L, x7R | x8L, x8R |
|---|---|---|---|---|
| y3 | R'1R | Gr'1R | R'3L | Gr'3L |
| y6 | Gb'1L | B'1L | Gb'3R | B'3R |
| y9 | R'2R | Gr'2R | R'4L | Gr'4L |
| y12 | Gb'2L | B'2L | Gb'4R | B'4R |

EVEN-NUMBERED FRAMES

| | x1L, x1R | x2L, x2R | x7R, 7L | x8R, x8L |
|---|---|---|---|---|
| y3 | R'1L | Gr'1L | R'3R | Gr'3R |
| y6 | Gb'1R | B'1R | Gb'3L | B'3L |
| y9 | R'2L | Gr'2L | R'4R | Gr'4R |
| y12 | Gb'2R | B'2R | Gb'4L | B'4L |

FIG. 10

ODD-NUMBERED FRAMES

| | x1 | | x2 | | x3 | | x4 | | x5 | | x6 | | x7 | | x8 | | x9 | | x10 | | x11 | | x12 | |
|---|---|---|---|---|---|---|---|---|---|---|---|---|---|---|---|---|---|---|---|---|---|---|---|---|
| | x1L | x1R | x2L | x2R | x3L | x3R | x4L | x4R | x5L | x5R | x6L | x6R | x7L | x7R | x8L | x8R | x9L | x9R | x10L | x10R | x11L | x11R | x12L | x12R |
| | R1 L | (R1) R | Gr1 L | Gr1 R | R4 L | R4 R | Gr4 L | Gr4 R | | | | | R7 L | (R7) R | Gr7 L | Gr7 R | R10 L | (R10) R | Gr10 L | Gr10 R | | | | |
| | Gb1 L | Gb1 R | B1 L | B1 R | Gb3 L | Gb3 R | B3 L | B3 R | | | | | Gb7 L | Gb7 R | B7 L | B7 R | Gb9 L | Gb9 R | B9 L | B9 R | | | | |
| | R2 L | (R2) R | Gr2 L | Gr2 R | (R5) L | (R5) R | Gr5 L | Gr5 R | | | | | (R8) L | (R8) R | Gr8 L | Gr8 R | (R11) L | (R11) R | Gr11 L | Gr11 R | | | | |
| | Gb2 L | Gb2 R | B2 L | B2 R | Gb4 L | Gb4 R | B4 L | B4 R | | | | | Gb8 L | Gb8 R | B8 L | B8 R | Gb10 L | Gb10 R | B10 L | B10 R | | | | |
| | R3 L | (R3) R | Gr3 L | Gr3 R | (R6) L | (R6) R | Gr6 L | Gr6 R | | | | | (R9) L | (R9) R | Gr9 L | Gr9 R | (R12) L | (R12) R | Gr12 L | Gr12 R | | | | |
| | Gb3 L | Gb3 R | B3 L | B3 R | Gb5 L | Gb5 R | B5 L | B5 R | | | | | Gb9 L | Gb9 R | B9 L | B9 R | Gb11 L | Gb11 R | B11 L | B11 R | | | | |

EVEN-NUMBERED FRAMES

| | x1 | | x2 | | x3 | | x4 | | x5 | | x6 | | x7 | | x8 | | x9 | | x10 | | x11 | | x12 | |
|---|---|---|---|---|---|---|---|---|---|---|---|---|---|---|---|---|---|---|---|---|---|---|---|---|
| | R1 L | (R1) R | Gr1 L | Gr1 R | R4 L | (R4) R | Gr4 L | Gr4 R | | | | | (R7) L | R7 R | Gr7 L | Gr7 R | (R10) L | R10 R | Gr10 L | Gr10 R | | | | |
| | Gb1 L | Gb1 R | B1 L | B1 R | Gb3 L | Gb3 R | B3 L | B3 R | | | | | Gb7 L | Gb7 R | B7 L | B7 R | Gb9 L | Gb9 R | B9 L | B9 R | | | | |
| | (R2) L | (R2) R | Gr2 L | Gr2 R | R5 L | (R5) R | Gr5 L | Gr5 R | | | | | (R8) L | R8 R | Gr8 L | Gr8 R | (R11) L | R11 R | Gr11 L | Gr11 R | | | | |
| | Gb2 L | Gb2 R | B2 L | B2 R | Gb4 L | Gb4 R | B4 L | B4 R | | | | | Gb8 L | Gb8 R | B8 L | B8 R | Gb10 L | Gb10 R | B10 L | B10 R | | | | |
| | (R3) L | (R3) R | Gr3 L | Gr3 R | R6 L | (R6) R | Gr6 L | Gr6 R | | | | | (R9) L | R9 R | Gr9 L | Gr9 R | (R12) L | R12 R | Gr12 L | Gr12 R | | | | |
| | Gb3 L | Gb3 R | B3 L | B3 R | Gb5 L | Gb5 R | B5 L | B5 R | | | | | Gb9 L | Gb9 R | B9 L | B9 R | Gb11 L | Gb11 R | B11 L | B11 R | | | | |

FIG. 11

| R1 UL | R1 UR | Gr1 UL | Gr1 UR |
|---|---|---|---|
| R1 DL | R1 DR | Gr1 DL | Gr1 DR |
| Gb1 UL | Gb1 UR | B1 UL | B1 UR |
| Gb1 DL | Gb1 DR | B1 DL | B1 DR |

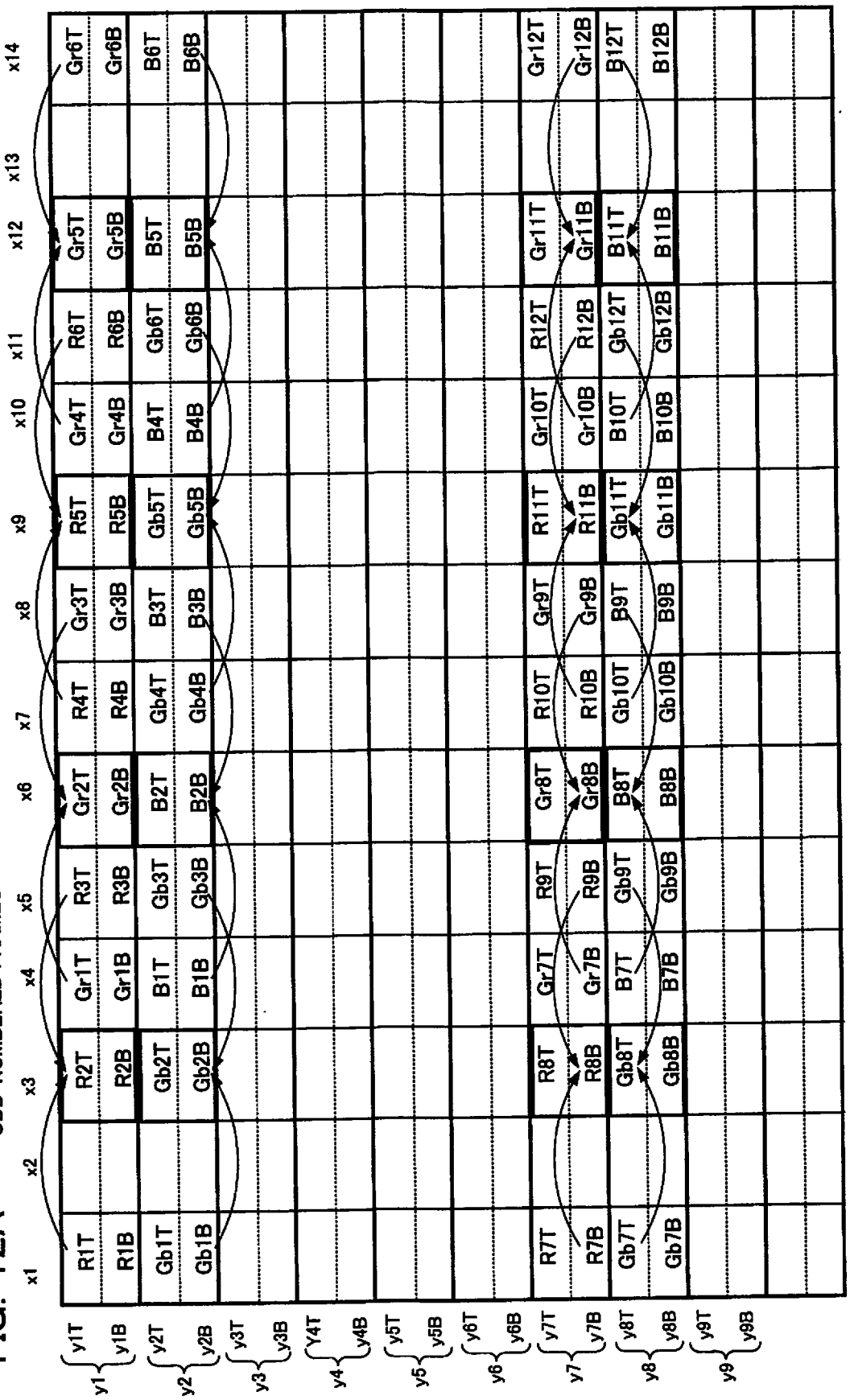

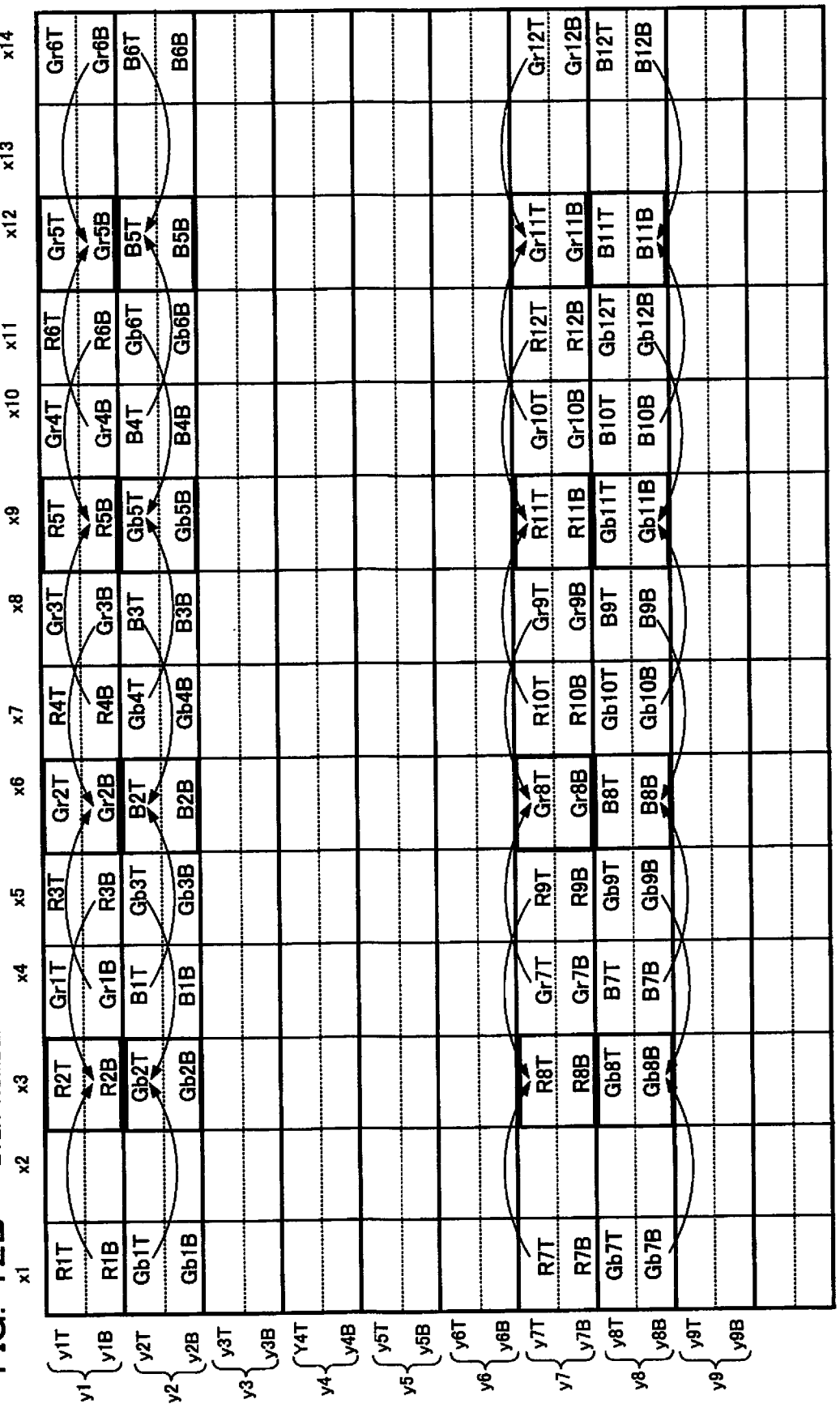
FIG. 12B  EVEN-NUMBERED FRAMES

IMAGE SENSOR, IMAGING DEVICE AND IMAGING METHOD

CROSS-REFERENCE TO RELATED APPLICATIONS

Benefit is claimed, under 35 U.S.C. § 119, to the filing date of prior Japanese Patent Application No. 2018-235610 filed on Dec. 17, 2018. This application is expressly incorporated herein by reference. The scope of the present invention is not limited to any requirements of the specific embodiments described in the application.

BACKGROUND OF THE INVENTION

1. Field of the Invention

The present invention relates to an image sensor having focus detection pixels for phase difference AF arranged on an image plane, and to an imaging method for this imaging device.

2. Description of the Related Art

In recent years the number of pixels of image sensors of digital cameras has increased, and image sensors with 20,000,000 to 40,000,000 pixels are mainstream. Such a large number of pixels are not required at the time of through image display where a through image is displayed on a rear surface panel or electronic viewfinder (EVF), or at the time of movie shooting when performing movie shooting. Therefore, at the time of through image display and movie shooting a number of output pixels from an image sensor is reduced by performing pixel addition and pixel thinning within the image sensor, to give a number of output pixels appropriate to through images and movie recording. As a result of reducing the number of pixels, it is possible to reduce A/D conversion processing within the image sensor and reduce image processing of an image processing engine, and reduction in power consumption and increase in speed (increased frame rate) can be expected.

Also, in order to make AF (autofocus) high speed, phase difference AF technology that uses pixels of the image sensor is widely used. This involves segmenting of photodiodes (PD) of the image sensor, and focus detection is performed utilizing the fact that if light that has passed through a single microlens is irradiated on respective segmented PDs, a phase difference arises in signal output of a plurality of PDs.

Conventionally, an image sensor has been for generation of image data, and in a case where outputs of PDs that have been segmented for the purpose of generating image data are combined (pixel addition) phase difference AF is no longer possible. There is therefore a problem of compatibility between pixel addition and phase difference AF. An imaging device that generates phase difference data for phase difference AF and two sets of image data for through image display from an image sensor has therefore been proposed in Japanese patent laid open number 2015-049283 (hereafter referred to as patent publication 1). With this imaging device, by processing output data of photodiodes that have been divided in two to the left and right for phase difference AF detection, two sets of image data are generated, namely output data of one among the two divided sides, and combined output data. From these two sets of output data, it is possible to obtain image data for through image display and phase difference data for phase difference AF.

In the imaging device disclosed in patent publication 1 described above, since the two sets of output data, namely one side output data and combined output data, are read out, circuit structure of the image sensor becomes complicated. Also, in order to generate phase difference data, both the one side output data and the combined output data are subjected to computational processing, there is a need for complicated circuitry, and power consumption for signal processing is also increased.

SUMMARY OF THE INVENTION

The present invention provides an image sensor that can output data for phase difference AF and data for image generation with a simple structure. The present invention also provides an imaging device and an imaging method that, as well as performing phase difference AF, can increase the speed of display/storage of a through image/movie, while preventing increase in power.

An image sensor of a first aspect of the present invention comprises pixels that have a plurality of micro-lenses arranged two-dimensionally in a matrix, and paired first pixel sections and second pixel sections that are arranged in correspondence with the respective micro-lenses, and a pixel signal generation circuit that repeatedly outputs a pixel signal corresponding to an image frame, the image frame being made up of a pixel signal that is a result of addition of pixel signals of a plurality of the first pixel sections, or a pixel signal that is a result of addition of pixel signals a plurality of the second pixel sections, wherein the pixel signal generation circuit in a first frame among a plurality of image frames, adds pixel signals of the first pixel sections corresponding to a first column of the micro-lenses in a column direction to generate a first pixel addition signal, adds pixel signals of the second pixel sections corresponding to a second column that is different to the first column in a column direction to generate a second pixel addition signal, and respectively outputs the first and second pixel addition signals, and in a second frame that is continuous to the first frame, adds outputs of the second pixel section corresponding to the first column in a column direction to generate a third pixel addition signal, adds outputs of the first pixel section corresponding to the second column in a column direction to generate a fourth pixel addition signal, and respectively outputs the third and fourth pixel addition signals.

An imaging device of a second aspect of the present invention is an imaging device having the image sensor of the first aspect, and comprises a phase difference detection circuit that is input with pixel addition signals from the image sensor and performs phase difference detection, wherein the phase difference detection circuit performs phase difference detection based on the first pixel addition signal and the second pixel addition signal, or performs phase difference detection based on the third pixel addition signal and the fourth pixel addition signal.

An imaging method of a third aspect of the present invention is on imaging method for an imaging device that is provided with pixels that have a plurality of micro-lenses arranged two-dimensionally in a matrix, and paired first pixel sections and second pixel sections that are arranged in correspondence with the respective micro-lenses, and comprises repeatedly outputting a pixel signal corresponding to an image frame, the image frame being made up of a pixel signal that is a result of addition of pixel signals of a plurality of the first pixel sections, or a pixel signal that is a result of addition of pixel signals a plurality of the second pixel sections, in a first frame among a plurality of image frames, adding pixel signals of the first pixel sections corresponding to a first column of the micro-lenses in a column direction to generate a first pixel addition signal, adding pixel signals of the second pixel sections corresponding to a second column that is different to the first column in a column direction to generate a second pixel addition signal, and respectively outputting the first and second pixel addition signals, and in a second frame that is continuous to the first frame, adding outputs of the second pixel section corresponding to the first column in a column direction to generate a third pixel addition signal, adding outputs of the first pixel section corresponding to the second column in a column direction to generate a fourth pixel addition signal, and respectively outputting the third and fourth pixel addition signals.

BRIEF DESCRIPTION OF THE DRAWINGS

FIG. 5A and FIG. 5B are plan views showing arrangement of pixels in the image sensor of the imaging device of the first embodiment of the present invention, with FIG. 5A showing pixel readout of odd number frames and FIG. 5B showing pixel readout of even number frames, and FIG. 6 is a drawing showing addition processing after pixel readout, for the image sensor of the imaging device of the first embodiment of the present invention.

FIG. 7 is a drawing showing a first modified example of addition processing after pixel readout, in the image sensor of the imaging device of the first embodiment of the present invention.

FIG. 8 is a drawing showing a second modified example of addition processing after pixel readout, in the image sensor of the imaging device of the first embodiment of the present invention.

FIG. 10 is plan view showing arrangement of pixels in the image sensor of the imaging device of the first embodiment of the present invention, and shows pixel readout of odd number frames and even number frames.

FIG. 11 is a drawing showing a modified example of pixel arrangement, in the image sensor of the imaging device of the first embodiment of the present invention.

FIG. 12A and FIG. 12B are plan views showing arrangement of pixels in an image sensor of an imaging device of a second embodiment of the present invention, with FIG. 12A showing pixel readout of odd number frames and FIG. 12B showing pixel readout of even number frames.

DETAILED DESCRIPTION OF THE PREFERRED EMBODIMENTS

An example where a digital camera is adopted as an imaging device of a preferred embodiment of the present invention will be described in the following. This digital camera has an imaging section, with a subject image being converted to image data by this imaging section, and the subject image being subjected to live view display on a display section arranged on the rear surface of the camera body based on this converted image data. A photographer determines composition and photo opportunity by looking at the live view display. At the time of a release operation image data is stored in a storage medium. Image data that has been stored in the storage medium can be subjected to playback display on the display section if playback mode is selected.

Also, with the preferred embodiment of the present invention a microlens for phase difference detection, and at least two photodiodes corresponding to this microlens, are arranged. The two photodiodes receive respective light fluxes that pass through different exit pupil regions of an imaging optical system, and output respective pixel signals. Phase difference is detected using pixel signals corresponding to the different exit pupil regions.

Also, with the preferred embodiment of the present invention, a pixel signal for pixels of one side (for example, left side pixels and right side pixels) for phase difference detection are output for every pixel of RGB pixels, and within a single photographing frame both a pixel signal for pixels of one side (for example the left side) and a pixel signal for pixels of the other side (for example the right side) are output. This means that if there are all pixel signals for a single photographing frame, it is possible to perform phase difference detection (refer, for example, to FIG. 5A).

Figure 9:
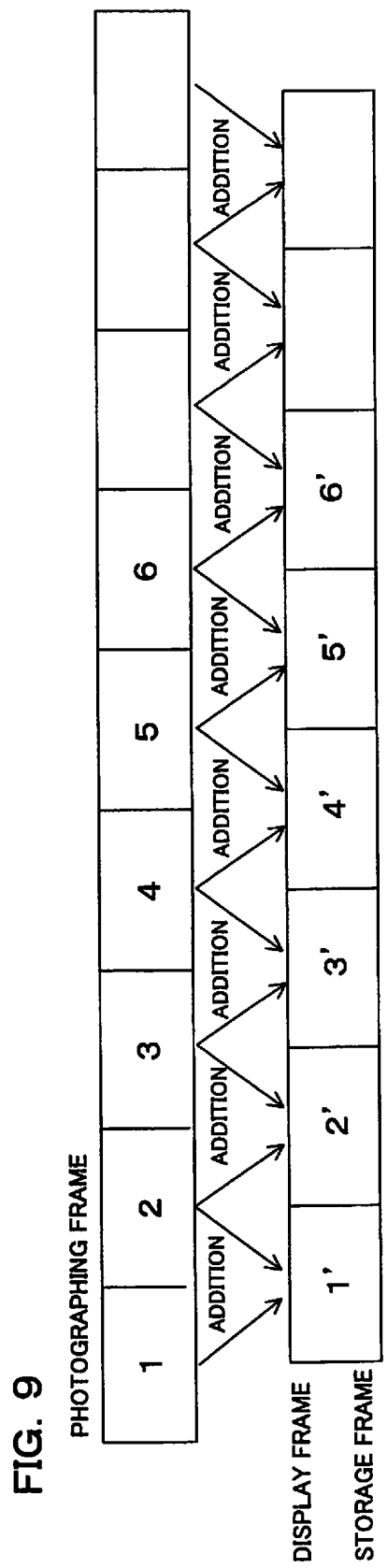
FIG. 9 is a drawing showing a relationship between photographing frames and display (storage) frames, in the imaging device of the first embodiment of the present invention.

Also, with the preferred embodiment of the present invention, an image for through image display or for movie recording is generated by adding pixel signals of corresponding pixel positions in odd-numbered frames and even number frames, (refer, for example, to FIG. 9). With only light flux of a pupil region for one side of the microlens it is not possible to generate an appropriate image, but a pixel signal for light flux corresponding to all regions of a single microlens is obtained by adding pixel signals respectively corresponding to light flux of both pupil regions, and so it is possible to generate an appropriate image.

Figure 1:
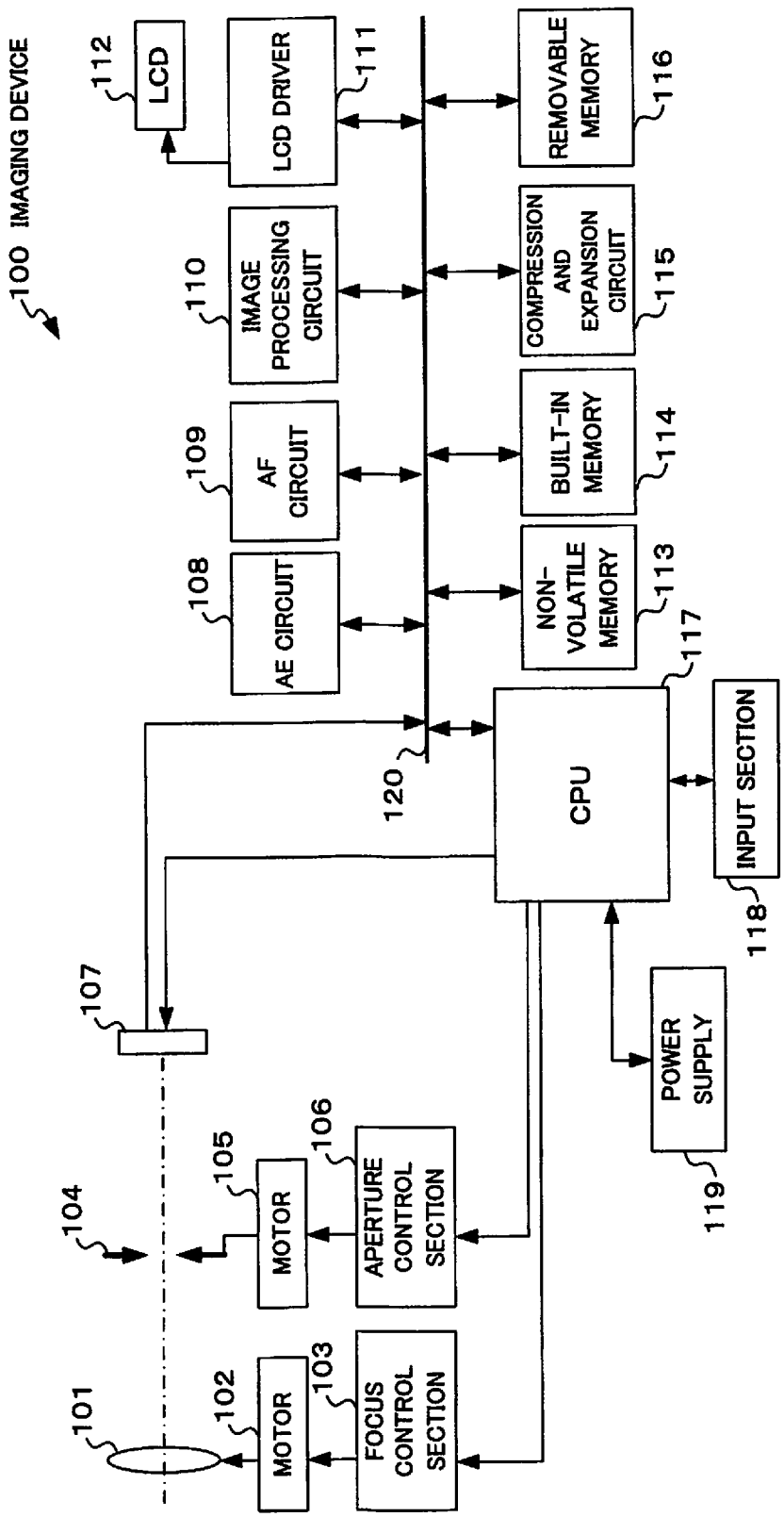
FIG. 1 is a block diagram mainly showing the electrical structure of an imaging device of a first embodiment of the present invention.

FIG. 1 is a block diagram showing the structure of an imaging device 100 relating to a first embodiment. This imaging device 100 comprises a lens 101, a motor 102 that drives the lens 101, a focus control section 103, an aperture mechanism 104, a motor 105 that drives the aperture mechanism 104, an aperture control section 106, an image sensor 107, an AE circuit 108, an AF circuit 109, an image processing circuit 110, a liquid crystal display (LCD) driver 111, an LCD 112, a nonvolatile memory 113, a built-in memory 114, a compression and expansion circuit 115, removable memory 116, a CPU (Central Processing Unit) 117, an input section 118, a power supply section 119 and a data bus 120. It should be noted that a lens barrel containing a lens 101 may be fixed to the camera body, or may be an interchangeable lens that can be attached to and removed from the camera body.

The lens 101 forms an optical image of a subject on the image sensor 107. The motor 102 moves the lens 101 in an optical axis direction, and changes focus state. The focus control section 103 moves the lens 101 to an in-focus position based on output of the AF circuit 109 and the CPU 117. The aperture mechanism 104 changes opening diameter, and in this way changes amount of light of subject light flux that has passed through the lens 101. The motor 105 performs drive so that the opening diameter of the aperture mechanism 104 becomes a specified size. The aperture control section 106 performs control based on output of the AE circuit 108 and the CPU 117 so that an aperture value for exposure control becomes an appropriate value.

The image sensor 107 converts an optical image that has been received on an image plane to an electrical signal, and generates an image signal. The image sensor 107 has a pixel section 22 (refer to FIG. 2) with a plurality of pixels (combining phase difference detection pixels and pixels for image generation) arranged two-dimensionally. Each pixel is constructed divided into a plurality of phase difference detection pixels, corresponding to a microlens L (refer to FIG. 3). The phase difference detection pixels generate photoelectric conversion signals by respectively subjecting light flux, that passes through regions resulting from subjecting a plurality of exit pupils of the lens 101, which is a photographing optical system, to pupil-division, to photoelectric conversion. While the image sensor 107 is constructed as a single CMOS image sensor provided with a primary color Bayer array color filter, this structure is not limiting. The detailed structure of the image sensor 107 will be described later using FIG. 2 to FIG. 4.

The image sensor 107 has pixels (a pixel section) comprising a plurality of micro-lenses (refer, for example, to the microlens L in FIG. 3) arranged two dimensionally in a matrix, and paired first pixel sections and second pixel sections arranged in correspondence with the respective micro-lenses. The image sensor 107 has a plurality of photo-diodes (refer to the photodiodes PD in FIG. 3) arranged, divided in a specified pupil division direction, so that a pixel signal is generated by subjecting respective light flux, that passes through different exit pupil regions of an imaging optical system for a single micro-lens (refer to the microlens L in FIG. 3), to photoelectric conversion. The image sensor 107 is also an image sensor having a pixel section in which a plurality of light receiving sections are arranged divided in a given pupil division direction, for a single micro-lens, so that a pixel signal is generated by subjecting respective light flux, that passes through different exit pupil regions of an imaging optical system, to photoelectric conversion.

The image sensor 107 is arranged on the optical axis of the lens 101, behind the aperture mechanism 104, and at a position where light flux from a subject is formed into an image by the lens 101. The image sensor 107 generates an image signal relating to a subject that has been formed into an image. Specifically, analog pixel signals that have been read out from each pixel of the image sensor 107 are converted to a digital signal by an A/D conversion processing section 23b, and digital image data (hereafter digital signals corresponding to analog image signals will be simply referred to as "image data") from the image sensor 107.

The AE circuit 108 obtains a brightness value based on image data that has been output from the image sensor 107, and based on this brightness value calculates exposure control values, such as exposure time and aperture value, so as to achieve an appropriate exposure level. It should be noted that some or all of the computations for exposure control value may be implemented in the CPU 117.

The AF circuit 109 determines defocus amount of the lens 101 and drive amount of the lens 101 based on phase difference AF data within the image data that has been output from the image sensor 107. The CPU 117 and the focus control section 103 cause the lens 101 to move to an in-focus position based on this defocus amount. It should be noted that some or all of the computation for lens defocus amount and drive amount may be implemented in the CPU 117.

The AF circuit 109 functions as a phase difference detection circuit (phase difference detection section) that is input with pixel addition signals output from the image sensor and performs phase difference detection. This phase difference detection circuit (phase difference detection section) performs phase difference detection based on the first pixel addition signal and the second pixel addition signal, or performs phase difference detection based on the third pixel addition signal and the fourth pixel addition signal. In odd-numbered frames shown in FIG. 5A, which will be described later, the first pixel addition signal and the second pixel addition signal are output, and in even-numbered frame shown in FIG. 5B the third pixel addition signal and the fourth pixel addition signal are output. The phase difference detection circuit (phase difference detection section) performs phase difference detection using these pixel addition signals. Also, the phase difference detection circuit (phase difference detection section) determines in-focus portions and non-focus portions within an image frame using phase difference detection based on pixel signals of the image frame. Within a photographing screen also, there are portions that are in focus and portions that are not in focus. Phase difference is detected for each area, and areas that have a phase difference smaller than a predetermined value may be determined to be in focus potions, and areas that have a phase difference larger than a predetermined value may be determined to be non-focus portions.

The image processing circuit 110 performs various image processing on image data that has been read out from the image sensor 107. As image processing, for example, there is demosaicing processing, tone conversion processing, white balance adjustment, edge processing, and combination processing of wide dynamic range image data etc.

The LCD driver 111 drives the LCD 112. The LCD 112 is a display that is arranged on a main body rear surface etc. of the imaging device, and performs display such as through image display, playback display of images that have already been taken, and display of menu screens etc.

The nonvolatile memory 113 is an electrically rewritable nonvolatile memory, and stores various programs, data for adjustment of the imaging device, user's setting data, etc. The built-in memory 114 is a high-speed writable/readable memory, and temporarily stores image data that has been read out from the image sensor 107. Also, the built-in memory 114 is used as a work memory for various processing in the image processing circuit 110.

At the time of image data storage, the compression and expansion circuit 115 compresses image data that has been generated by the image processing circuit 110 (still picture data or movie data). Also, at the time of image data playback, the compression and expansion circuit 115 expands image data that has been stored in a compressed state in the removable memory 116 to return that data to image data before compression. The removable memory 116 is an electrically rewritable non-volatile memory such as card memory for storage of image data, and can be attached to and removed from the imaging device 100.

The CPU 117 is a controller (processor) and performs overall unified control of the imaging device 100 in accordance with programs that have been stored in the nonvolatile memory 113. The CPU 117 has a function as an imaging control section that controls exposure amount for movie shooting and still picture shooting, and controls shooting timing. It should be noted that although it is assumed that the CPU 117 is a single processor, this is not limiting and the CPU 117 may be divided into a plurality of processors, and various modifications are possible, such as having a structure where the CPU 117 is integrated with the AE circuit 108, AF circuit 109, and image processing circuit 110 etc.

Also, the CPU 117 functions as a processor (control section) that is input with pixel signals output from the image sensor and generates image data for display or storage. This processor (control section) adds a first pixel signal and fourth pixel signal, and adds a second pixel signal and third pixel signal, to generate image data for display or storage (referred to FIG. 9). Also, in portions that have been determined to be in-focus, the processor (control section) generates image data for display or storage by correcting the first pixel signal and the second pixel signal, or correcting the third pixel signal and the fourth pixel signal, without performing addition of the first pixel signal and the fourth pixel signal, and without performing addition of the second pixel signal and the third pixel signal.

The input section 118 is an interface for the user to issue instructions to the imaging device 100, and various operations such as setting of various modes and a release operation etc. are instructed. The power supply section 119 supplies power to the whole of the imaging device 100. The data bus 120 is a bus line for performing interchange of various data.

Next, the structure of the image sensor 107 will be described using FIG. 2. The image sensor 107 has photodiodes that have been divided into a plurality of phase difference detection pixels for a single pixel, and subjects subject light flux to photoelectric conversion using each of the photodiodes to generate a photoelectric conversion signal. The image sensor 107 generates an image signal and a phase difference detection signal based on the photoelectric conversion signal that has been generated. The phase difference detection signal is generated based on a photoelectric conversion signal from any one photodiode within a single pixel. The image signal is generated by adding all phase difference detection signals corresponding to a single pixel.

Figure 2:
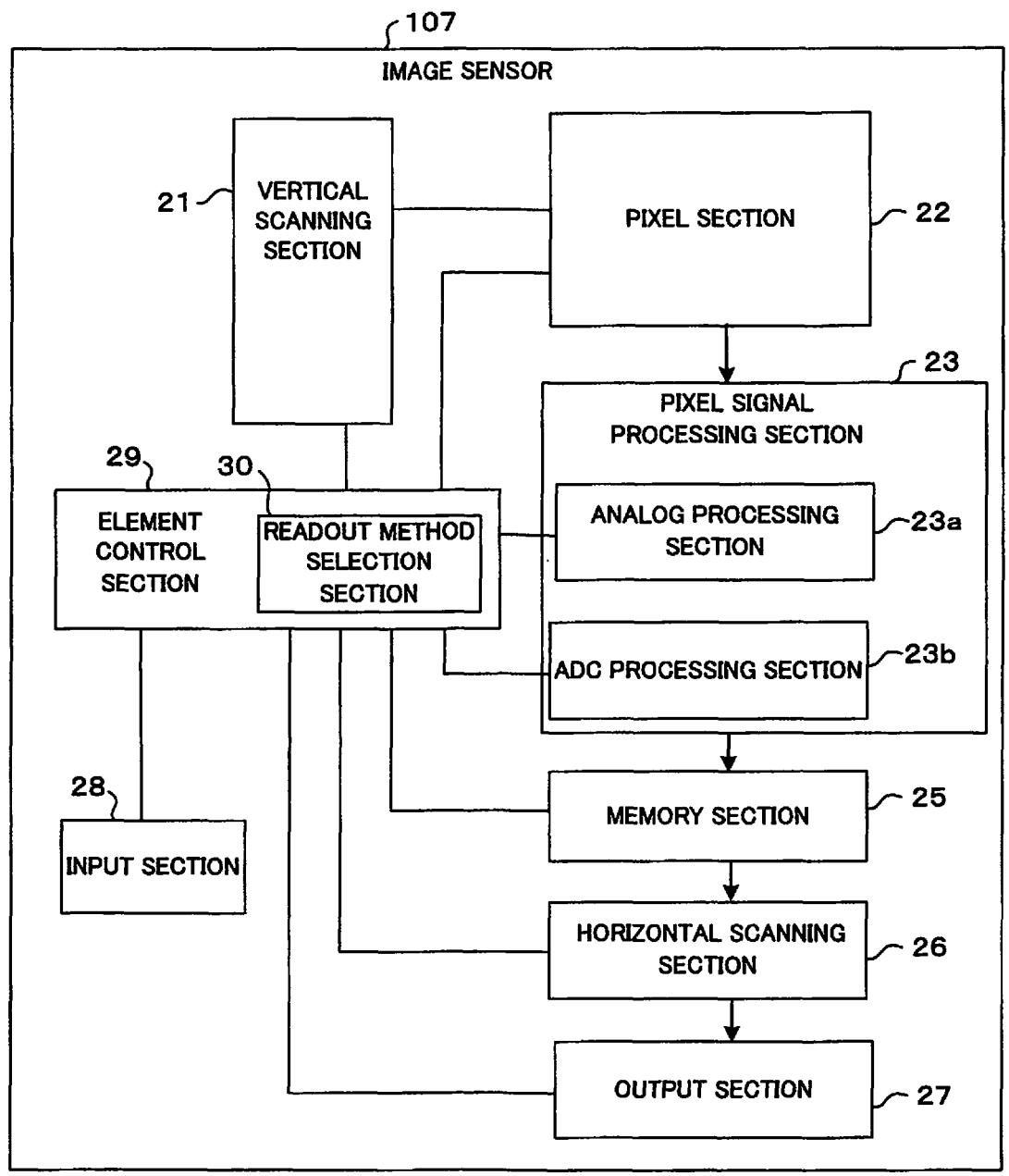
FIG. 2 is a block diagram mainly showing the electrical structure of an image sensor of the first embodiment of the present invention.

In the example shown in FIG. 2, the image sensor 107 comprises a vertical scanning section 21, a pixel section 22, a pixel signal processing section 23, memory section 25, horizontal scanning section 26, output section 27, input section 28, and element control section 29.

The above-described pixels are arranged in the pixel section 22. Generation of the photoelectric conversion signal is performed by at least one section among the vertical scanning section 21 to output section 27, and the element control section 29 etc. Structure of each pixel arranged in the pixel section 22 will be described later using FIG. 3. Also, electrical connection of the photodiodes within a single pixel will be described later using FIG. 4.

The vertical scanning section 21 has a vertical scanning circuit, and performs scanning in a vertical direction by successively selecting pixel rows (lines) in a horizontal direction of the pixel section 22. This vertical scanning section 21 selects a particular line, and controls charge accumulation time of pixels (exposure time) by performing resetting and transfer of each pixel of the line that has been selected.

The pixel signal processing section 23 has a pixel signal processing circuit, processes pixel signals that have been read out from the pixel section 22, and has an analog processing section 23*a* and an ADC processing section 23*b*. The analog processing section 23*a* has an analog processing circuit, and subjects an analog pixel signal that has been read out from the pixel section 22 to analog signal processing. This analog processing section 23*a* includes, for example, a preamp that amplifies the pixel signal, and a correlated double sampling (CDS) circuit that subtracts reset noise from the pixel signal, etc.

The analog digital conversion processing section (ADC processing section) 23*b* has an A/D conversion circuit, and converts the analog pixel signal that has been output from the analog processing section 23*a* to a digital pixel signal. This ADC processing section 23*b* adopts a structure, such as exemplified by camera ADC, for example, whereby a pixel signal that has been read out from the pixel section 22 is subjected to AD conversion by an analog to digital converter (ADC) for every line.

As will be described later, with this embodiment pixel signals of pixels of one side for phase difference detection are subjected to addition processing for every pixel column (for example, column x1, column x2, . . . etc. in FIG. 5A). The pixel signal processing section 23 performs addition processing of pixel signals of this side. With the addition processing, after having performed addition using analog computation in the analog processing section 23*a*, it is possible to perform A/D conversion using the ADC processing section 23*b*. Also, conversely, addition using digital computation may be performed after AD conversion of this pixel signal in the ADC processing section 23*b*. Addition processing may also be performed using various methods besides this.

The pixel signal processing section 23 functions as a pixel signal generation circuit that repeatedly outputs a pixel signal corresponding to an image frame, the image frame being made up of a pixel signal that is a result of addition of pixel signals of a plurality of the first pixel sections, or a pixel signal that is a result of addition of pixel signals of a plurality of the second pixel sections. Also, this pixel signal generation circuit (pixel signal generating section), in a first frame among a plurality of image frames (for example, the odd-numbered frames in FIG. 5A), generates a first pixel addition signal (for example, Gb'1L in FIG. 6) by adding pixel signals (for example, Gb1L, Gb2L, Gb3L) of the first pixel section corresponding to a first column (for example, x1 in FIG. 5A) of a microlens in a column direction and a second pixel addition signal (for example, Gr'1R in FIG. 6) by adding pixel signals (for example, Gr1R, Gr2R, Gr3R) of a second pixel section corresponding to a second column (for example, column x2 in FIG. 5A), that is different from the first column, in a column direction, and respectively outputs the first pixel addition signal and the second pixel addition signal, and in a second frame that is continuous to the first frame (for example, the even-numbered frames in FIG. 5B) generates a third pixel addition signal (for example, Gb'1R in FIG. 6) by adding outputs (for example, Gb1R, Gb2R, Gb3R) of the second pixel section corresponding to a first column in a column direction and a fourth pixel addition signal (for example, Gr'1L in FIG. 6) by adding outputs (for example, Gr1L, Gr2L, Gr3L) of the first pixel section corresponding to the second column, in a column direction, and respectively outputs the third pixel addition signal and the fourth pixel addition signal. As a result, if pixel addition signals of the same color for the first column and the second column of a single frame, among a plurality of odd numbered frames or even-numbered frames, are used, it is possible to detect phase difference. It should be noted that the column direction represents a direction in which rows along a column that is defined as a pixel arrangement are arrayed. For example, in FIG. 5A and FIG. 5B, in each of the rows (lines) y1, y2, . . . , of the drawing x1, x2, x3, . . . , are arranged, and this direction is the row direction. Also, R pixels and Gr pixels are alternately arranged in each row y1, y3, y5, . . . , and the column direction represents a direction in which rows in which the R pixels and Gr pixels are arranged are aligned, in other words, a direction that is orthogonal to the row direction in which the R pixels and Gr pixels are arranged. The same also applies to each row of y2, y4, . . . .

Also, the pixel signal generation circuit (pixel signal generating section) has a first column and second column arranged adjacently, and generates a pixel addition signal by adding pixel signals of first and second pixel sections of the adjacent first and second columns in the column direction (for example, in FIG. 5A column x1 and column x2 are adjacent). The pixel signal generation circuit, for a plurality of image frames, generates a first pixel addition signal by adding pixel signals corresponding to color filters of the same color, among pixel signals of the first pixel section corresponding to the first column, in the column direction (for example, addition of R1L, R2L, R3L in FIG. 5A), and generates a second pixel addition signal by adding pixel signals corresponding to color filters of the same color, among pixel signals of the second pixel section corresponding to the second column, in the column direction (for example, addition of Gr1R, Gr2R, Gr3R in FIG. 5A)

The memory section 25 has a memory, and is configured by an electrically rewritable volatile memory circuit etc. that temporarily holds pixel signals that have been converted by the ADC processing section 23*b*.

The horizontal scanning section 26 has a horizontal scanning circuit, and reads out pixel signals (image pixel signals and focus detection pixel signals) from the memory section 25 in successive columns.

The output section 27 has an output circuit, and generates pixel signal columns by arranging pixel signals that have been read out from the horizontal scanning section 26, converts to an output signal format such as a serial signal or differential signal etc., and outputs the converted result. It should be noted that this output section 27 or the above described ADC processing section 23*b* etc. function as a sensitization section that performs sensitization processing (signal amplification processing in accordance with ISO sensitivity that has been set).

The input section 28 has an input circuit, and receives synchronization signals, a reference clock and operation setting information etc. relating to control of the image sensor 107 from the CPU 117.

The element control section 29 has an imaging control circuit, and is for controlling each block within the image sensor 107 in conformity with synchronization signals and a reference clock that have been received via the input section 28, and is provided with a readout method selection section 30. Also, the element control section 29 receives operation setting commands, such as commands for switching imaging drive mode, from the CPU 117 via the input section 28, and controls each block within the image sensor 107.

The readout method selection section 30 has a selection circuit, and selects and sets a readout method for readout from the image sensor 107 based on operation setting information (for example, camera modes such as still picture shooting, movie shooting, live view, AF etc.) that has been received via the input section 28. The element control section 29 controls each section within the image sensor 107 in accordance with a readout method that has been set by the readout method selection section 30.

It should be noted that in FIG. 2 a structural example is shown in which the image sensor 107 is not only provided with the vertical scanning section 21 and the pixel section 22, but is also provided with the pixel signal processing section 23—element control section 29. However, the structure of the image sensor 107 is not thus limited, and it is possible for one or more of the pixel signal processing section 23—element control section 29, for example, to be arranged externally to the image sensor 107.

Next, the structure of the focus detection pixels and image pixels arranged in the pixel section 22 will be described using FIG. 3. As has been described above, the pixel section 22 is a pixel array section having pixels arranged two dimensionally (for example, in the vertical direction (column direction) and horizontal direction (row direction)).

Figure 3:
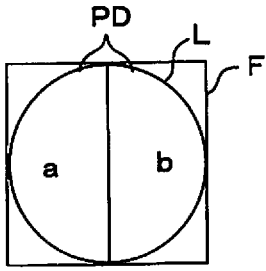
FIG. 3 is a diagram showing the structure of pixels of the image sensor relating to the first embodiment of the present invention.

FIG. 3 is a table showing an example of a pixel structure in which two or four photodiodes PD are arranged in a single microlens L. In FIG. 3, a 2PD pixel structure and a 4PD pixel structure are exemplified as structures for the image pixels. The 2PD pixel structure has two photodiodes PD arranged for a single microlens L. The 4PD pixel structure has four photodiodes PD arranged for a single microlens L.

Each pixel is configured with a microlens L, color filter F and photodiode PD arranged sequentially in a lamination direction facing from an object side to an image side. Here, the microlens L is for increasing light amount reaching the pixels by concentrating light, and effectively making a numerical aperture of the pixels large. Also, regarding the color filter F, in a case, for example, of a primary color Bayer array color filter, either of an R filter, G filter or B filter is provided in accordance with that pixel position. The microlens L functions as a plurality of micro-lenses arranged two-dimensionally in a matrix. The microlens L and photodiodes PD function as pixels having paired first pixels and second pixels that are arranged in correspondence with respective micro-lenses. The color filter F functions as a plurality of color filters respectively corresponding to a plurality of micro-lenses.

In a case of the 2PD pixel structure shown in FIG. 3, two photodiodes PD are arranged in the imaging range of a single microlens L. Two photodiodes PD are divided into left and right in the case where phase difference in the horizontal direction is detected, and divided into top and bottom in the case where phase difference in the vertical direction is detected. As a result, a single pixel has two focus detection pixels a and b.

On the other hand, in a case of the 4PD pixel structure shown in FIG. 3, four photodiodes PD are arranged in the imaging range of a single microlens L. The four photodiodes PD are divided into four, namely left, right, top, and bottom, so that it is possible to detect phase difference in the horizontal direction and in the vertical direction. Specifically, the four photodiodes PD are respectively arranged at upper left, lower left, upper right, and lower right positions. As a result, a single pixel has four focus detection pixels a, b, c and d.

In the descriptions of FIG. 5A, which will be described later, and after, examples have two photodiodes that have been divided left and right. However, here, as the structure of the image sensor 107, description will be given of an example of a case where all pixels have the 4PD pixel structure. However, this does not mean that some pixels of the image sensor 107 can be prevented from having a 4PD pixel structure or a 2PD pixel structure.

Figure 4:
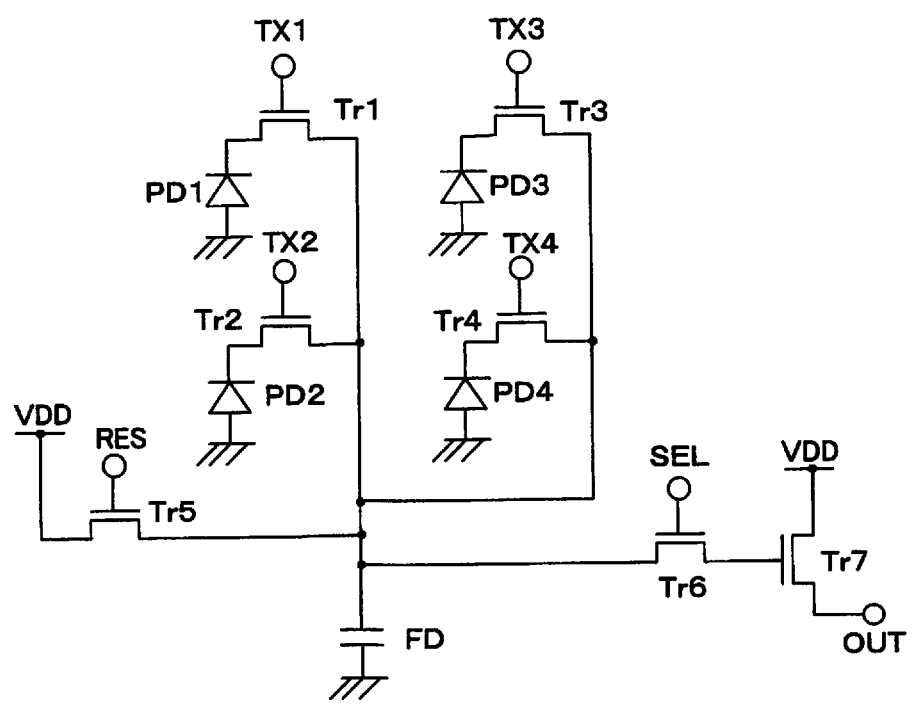
FIG. 4 is a circuit diagram showing the electrical structure of a pixel of the imaging device of the first embodiment of the present invention.

Further, in a case where outputs of photodiodes PD are subjected to vertical two pixel addition using the circuit of FIG. 4, which will be described later, namely, in a case where (a+b) and (c+d) in FIG. 3 are calculated, the output pixel signals constitute phase difference detection pixel signals for detecting phase difference in the horizontal direction (vertical line detection). In a case where outputs of photodiodes PD are similarly subjected to horizontal two pixel addition, namely when (a+c) and (b+d) in FIG. 3 are calculated, output pixel signals constitute a phase difference detection pixels signal for detecting phase difference in the vertical direction (horizontal line detection).

In the case of the 4PD pixel structure shown in FIG. 3, of the phase difference detection pixels signals for vertical line detection and the phase difference detection pixels signals for horizontal line detection, one constitutes a pair of phase difference detection pixel signals for a first pupil-division direction, and the other constitutes a pair of phase difference detection pixel signals for a second pupil-division direction. Further, in a case where outputs of photodiodes PD are similarly subjected to four pixel addition, namely in the case where (a+b+c+d) in FIG. 3 is calculated, the result is an image pixel signal.

Next, a structural example of a pixel of the 4PD pixel structure will be described using the circuit diagram shown in FIG. 4.

For a pixel of the 4PD pixel structure, as was shown in FIG. 3, four photodiodes PD1-PD4 are arranged at positions corresponding to a single microlens L. Specifically, four photodiodes PD1-PD4 are respectively arranged at upper left, lower left, upper right, and lower right positions within a range of the microlens L in which an optical image is formed.

Transistors Tr1-Tr4 that function as switches are respectively connected to the four photodiodes PD1-PD4. If control signals TX1-TX4 from the vertical scanning section 21 are respectively applied to the transistors Tr1-Tr4, on-off states of the transistors Tr1-Tr4 are respectively controlled.

Each transistor Tr1-Tr4 is connected to a floating diffusion FD. This means that if a transistor Tr is turned on, signal charge of a photodiode PD corresponding to this transistor Tr is transferred to the floating diffusion FD.

Also, one end of a transistor Tr5 that functions as a switch is connected between each transistor Tr1-Tr4 and the floating diffusion FD, with the other end of the transistor Tr5 being connected to a power supply voltage VDD. By applying a reset signal RES to transistor Tr5, on off states for the power supply voltage VDD side and the floating diffusion FD side are controlled. With this structure, if the transistor Tr5 is turned on, the floating diffusion FD is reset. Also, by turning the transistor Tr5 on in a state where the transistors Tr1-Tr4 are turned on, the photodiodes PD1-PD4 are reset.

The floating diffusion FD is connected to an output terminal OUT via a transistor Tr6 that functions as a switch, and transistor Tr7 that is connected to the power supply voltage VDD and functions as an amplifier. If a selection signal SEL is applied to the transistor Tr6, a voltage value of the floating diffusion FD is amplified by transistor Tr7, and read out from the output terminal OUT.

Next, pixel signal read out and addition processing will be described using FIG. 5A and FIG. 5B. With the example shown in FIG. 5A and FIG. 5B, for a single microlens respective photodiodes are arranged at left and right positions (left right divided into two type). Also, at the time of through image display and at the time of movie shooting, pixel addition is performed by horizontal 1/3 thinning and vertical 3/3 addition. Horizontal 1/3 thinning uses only one pixel in the horizontal direction, among three pixels, as pixel data, and the other two pixels are not used. Also, vertical 3/3 addition uses addition of pixel data of all three pixels in the vertical direction. Also, for an R pixel a color filter at a front side (lens 101 side) of a photodiode is red, while a color filter for a B pixel is blue, and color filters for Gr pixels and Gb pixels are green. It should be noted that in the drawings description will be given with the vertical direction as a column direction, and the horizontal direction as a row direction.

In FIG. 5A, a position (x1, y1) is a pixel position of a R pixel, R1L represents a left side R pixel, within a left right divided into two type pixel, and R1R represents a right side R pixel within the same type. A position (x2, y1) is a pixel position of a Gr pixel, with Gr1L representing a left side Gr pixel, within a left right divided into two type pixel, and Gr1R representing a right side Gr pixel within the same type. In row y1, as was described previously, position (x1, y1) is an R pixel, position (x2, y1) is a Gr pixel, position (x3, y1) is an R pixel, position (x4, y1) is a Gr pixel, . . . , position (x7, y1) is an R pixel, position (x8, y1) is a Gr pixel. Specifically, in row y1 R pixels and Gr pixels are alternately arranged. It should be noted that in FIG. 5A, pixels are also arranged in the same way at (y1, x3), (y1, x4), (y1, x5), (y1, x6), (y1, x9), (y1, x10), (y1, x11), (y1, x12). However, at the time of through image display and movie shooting these pixel signals are not used (because of horizontal 1/3 thinning), and so pixel description will be omitted. The same also applies to other rows.

A position (x1, y3) is a pixel position of a R pixel, R2L represents a left side R pixel, within a left right divided into two type pixel, and R2R represents a right side R pixel within the same type. A position (x2, y3) is a pixel position of a Gr pixel, with Gr2L representing a left side Gr pixel, within a left right divided into two type pixel, and Gr2R representing a right side Gr pixel within the same type. In row y3, as was described previously, position (x1, y3) is an R pixel, position (x2, y3) is a Gr pixel, position (x3, y3) is an R pixel, position (x4, y3) is a Gr pixel, . . . , position (x7, y3) is an R pixel, position (x6, y3) is a Gr pixel. Specifically, in row y3 R pixels and Gr pixels are alternately arranged.

Position (x1, y4) is a pixel position of a Gb pixel, Gb1L represents a left side Gb pixel within a left right divided into two type, and Gb1R represents a right side Gb pixel within the same type. A position (x2, y4) is a pixel position of a B pixel, B1L represents a left side B pixel, within a left right divided into two type pixel, and B1R represents a right side B pixel within the same type. In row y4, as was described previously, position (x1, y4) is a Gb pixel, position (x2, y4) is a B pixel, position (x3, y4) is an Gb pixel, position (x4, y4) is a B pixel, . . . , position (x7, y4) is a Gb pixel, position (x8, y4) is a B pixel. Specifically, in row y4 Gb pixels and B pixels are alternately arranged. Accordingly, with this embodiment, the first pixel section (for example, R1L, R2L, R3L, . . . ) and the second pixel section (for example, R1R, R2R, R3R, . . . ) constitute pairs in the column direction.

In this way, with this embodiment, on the image plane of the image sensor 107 R pixels and Gr pixels are arranged alternatively in a row direction (arrangement direction of columns) in rows y1, y3, y5, y7, . . . , and Gb pixels and B pixels are arranged alternately in the row direction (arrangement direction of columns) in rows y2, y4, y6, y8, . . . . In other words, in columns x1, x3, x5, x7, . . . , R pixels and Gb pixels are arranged alternately in the column direction (arrangement direction of rows), and in columns x2, x4, x6, x8, . . . , Gr pixels and B pixels are arranged alternately in the column direction (arrangement direction of rows).

When adding three vertical pixels only left side pixels (called "L side pixels") within each pixel are added, and only right side pixels (called the "R side pixels") are added. Specifically, as shown in FIG. 5A, in a first column of R pixels (column x1), in the case of adding only left side pixels, three pixel values of R1L, R2L and R3L at positions (x1L, y1), (x1L, y3), and (x1L, y5) are added. Also, in a first column of R pixels (column x1), in the case of adding only right side pixels, three pixel values of R1R, R2R and R3R at positions (x1R, y1), (x1R, y3), and (x1R, y5) are added. It should be noted that with this embodiment vertical three pixel addition is performed, but the number of pixels to be added may be appropriately changed in accordance with design values.

It should be noted that for the third column (column x3) to the sixth column (column x6), at the time of readout addition processing is not required due to thinning having been performed. Also, although not illustrated, the 13$^{th}$ column adding only L side pixels and the 14$^{th}$ column adding only R side pixels, namely R/L pixels, are switched and added. In this way, for R pixels, Gr pixels, Gb pixels and B pixels, addition of only R side pixels and addition of only L side pixels in each column is alternately switched.

Further, in odd numbered frames and even numbered frames columns in which only R side pixels are added and columns in which only L side pixels are added are alternately switched (specifically, R and L are reversed). An image signal for a single frame is generated from the image sensor 107 using pixel signals that have been read out from pixels in accordance with a designated readout method. Image signals for a single frame are read out at given time intervals, to give alternate odd number frames and even number frames. Previously described FIG. 5A shows pixel readout for odd-numbered frame, and FIG. 5B shows pixel readout for even-numbered frames.

In even-numbered frames, as shown in FIG. 5B, columns that are read out are different to those of the odd-numbered frames of FIG. 5A. Specifically, in odd-numbered frames pixels for the x1L direction, x2R direction, x7R direction and x8L direction were read out. Conversely, in even-numbered frames pixels for the x1R direction, x2L direction, x7L direction and x8R direction are read out.

As has been described above, in odd-numbered frames addition values of L side pixels of a first column (column x1, column x7, . . . ) are read out, and addition values of R side pixels of a second column (column x2, column x8, . . . ) are read out. Next, in even-numbered frames addition values of R side pixels of a first column (column x1, column x8, . . . ) are read out, and addition values of L side pixels of a second column (column x2, column x7, . . . ) are read out. In this way, pixels that are read out are alternately switched in accordance with odd-numbered frames or even-numbered frames.

FIG. 6 shows readout pixel addition values that have been alternately switched, as described above. The left side of FIG. 6 shows pixel addition results for odd-numbered frames, and the right side shows pixel addition results for even-numbered frames. In the odd-numbered frames of FIG. 6, R'1L represents an addition value for an R1L pixel value, R2L pixel value and R3L pixel value. It should be noted that the notations for the row of L'1L in FIG. 6 are shown as examples of row for R2L pixel values. Similarly, Gr'1R represents an addition value for a Gr1R pixel value, Gr2R pixel value, and Gr3R pixel value. Gb'1L represents an addition value for a Gb1L pixel value, Gb2L pixel value and a Gb3L pixel value. B'1R represents an addition value for a B1R pixel value, B2R pixel value and B3R pixel value. Other addition values are also calculated similarly, and so detailed description is omitted.

Looking at addition values of Gb and Gr pixels, which are for the same color within the same frame, in odd numbered columns and even numbered columns addition values for right side pixel values for Gb or Gr, and addition values for left side pixel values for Gr or Gb are alternated. For example, looking at the example shown in FIG. 6, in odd-numbered frames an addition value Gb'1L for left side pixel values and an addition value Gr'R for right side pixel values constitute additional values for G (Gr, Gb), as will be understood from comparison of column x1L and column x2R. The addition value Gb'1L for left side pixels and addition value Gr'1R for right side pixel values are for different micro-lenses, in accordance with pupil-division, and the micro-lenses are positioned close to each other, which means that they can be used as pairs of signals for phase difference detection. Phase difference detection is performed using a plurality of additions values Gb'1L, Gb2L, . . . of column x1L and a plurality of addition values Gr'1R, Gr'2R, . . . of column x2R. For even-numbered frames also, similarly, phase difference detection is performed using addition values Gb'1R, Gb'2R, for right side Gb pixels of column x1R, and addition values Gr'1L, Gr'2L, . . . for left side Gr pixel values of column x2L. In this way, it is possible to perform phase difference detection based on image data of a single odd-numbered frame or even-numbered frame.

Also, pixel addition values for the same position in odd-numbered frames and even-numbered frames of FIG. 6 have respective relationships of left side and right side, or right side and left side. Pixel addition values for the same positions in the odd-numbered frames and the even-numbered frames are added and image data is combined, and it is possible to generate a frame that is made up of pixel values that have not been subjected to pupil-division. By combining odd-numbered frames and even-numbered frames that have been acquired successively in a short time, it is possible to generate image data for storage and display for which lowering of image quality has been inhibited.

The above is a description for G pixels, but it is possible to perform phase difference detection for R pixels and B pixels also with the same method. For example, in the odd-numbered frames of FIG. 6, it is possible to perform phase difference detection using R'1L, R'2L, . . . , and R'3R, R'4R, . . . . In this case, a distance, as a positional relationship between the pair of R'1L and R'3R is larger than for the case of G pixels, which means that phase difference detection precision becomes lower. However, in a focus state where Bokeh not in the vicinity of in-focus is large, since a direction of phase difference deviation is important phase difference detection using R pixels and B pixels is effective, and detection of only phase difference deviation direction may also be performed.

As has been described above, since it is better for vertical direction addition pixels for G pixels (left side L/right side R) to be paired up in odd-numbered columns and even-numbered columns, a method other than the addition method that was shown in FIG. 5A, FIG. 5B and FIG. 6 may also be used. FIG. 7 shows arrangement of pixel addition values corresponding to a first modified example of an addition method. In FIG. 7, pixels to be added within the same column were switched between L and R for every color, for example, in columns x1L and x1R in odd-numbered frames R pixels that are L and Gb pixels that are R are added.

In the example shown in FIG. 7, for Gb pixels, in row y6, in columns x1L and x1R, and in columns x7R and x7L, respectively, of odd-numbered frames, there are pixel addition values (Gb'1R) of right side pixels (Gb1R, Gb2R, Gb3R) and pixel addition values (Gb'3L) of left side pixels (Gb7L, Gb8L, Gb9L) of FIG. 5. For Gb pixels, in row y6, in columns x1R and x1RL, and in columns x7L and x7R, respectively, of even-numbered frames, there are pixel addition values (Gb'1L) of left side pixels (Gb1L, Gb2L, Gb3L) and pixel addition values (Gb'3R) of right side pixels (Gb7R, Gb8R, Gb9R) of FIG. 5.

Similarly, for Gr pixels, in row y3, in columns x2L and x2R, and in columns x8L and 8R, respectively, of odd-numbered frames there are left side pixel addition values Gr'1L, and right side pixel addition values Gr'3R. Similarly, for Gr pixels, in row y3, in columns x2R and x2L, and in columns x8L and x8R, respectively, of even-numbered frames there are left side pixel addition values Gr1R, and right side pixel addition values Gr'3L.

Here, in odd-numbered frames right side pixel addition values Gb'1R and left side pixel addition values Gr'1L constitute a pair. Also, in even-numbered frames left side pixel addition values Gb'1L and right side pixel addition values Gr'1R constitute a pair. Accordingly, looking at the pixel addition values for G pixels, the left side addition values and right side addition values are arranged so as to form pairs. Looking at pixel addition values of the same color other than G pixels, left side addition values and right side addition values are alternately arranged in the row direction. Accordingly, it is possible to treat the left side addition values and the right side addition values of the same color as a pair for phase difference detection. Further, in odd-numbered frames and even-numbered frames, for the same positions left-sided addition values and right side addition values are alternately switched.

FIG. 8 shows a second modified example of the addition method. Similarly to the first modified example, the second modified example has pixels to be added within the same column switched between L and R for each color, and positions of pixels and an L/R correspondence relationship is different from the first modified example. For example, in columns x1L and x1R of odd-numbered frames, for R pixels right side pixels R are added and for Gb pixels left side pixels L are added.

With the example shown in FIG. 8, for R pixels, in row y3, in columns x1L and x1R, and in columns x7L and x7R, respectively, of odd-numbered frames there are right side pixel addition values R'1R and left side pixel addition values R'3L. For R pixels, in even-numbered frames for row y3 in columns x1L and x1R, and columns x7L and x7R, respectively, there are left side pixel addition values R'1L and right side pixel addition values R'3R. Similarly, for Gr pixels, Gb pixels and B pixels also, the left side pixel addition values and the right side pixel addition values are made into pairs. Accordingly, looking at pixel addition values of the same color, left side addition values and right side addition values are alternately arranged in the row direction. Further, in odd-numbered frames and even-numbered frames, for the same positions left-sided addition values and right side addition values are alternately switched.

In this way, with this embodiment and the modified examples, for each color within a single frame right side pixel addition values and left side pixel addition values are arranged so as to constitute pairs. As a result, within a single frame, it is possible to perform phase difference detection using right side pixel addition values and left side pixel addition values, and focus adjustment using phase difference AF becomes possible.

However, with the schemes described this far only left side pixel addition values or right side pixel addition values of each color pixels are output, which means that it is not possible to display or store an image signal as a through image or movie image. Therefore, as shown in FIG. 9, right side pixel values and left side pixel values are added by further adding associated addition values of corresponding position pixels of odd-numbered frames and even-numbered frames. Since light flux that has passed through a single micro lens is divided and made incident on a photodiode for a right side pixel and a photodiode for a left side pixel, a pixel value for light flux that has passed through a single microlens is derived by adding both pixel values. It is possible to use a combined image signal resulting from this additional processing as a through image and a movie image.

In the example shown in FIG. 9, associated pixel addition values for corresponding positions of photographing frame 1 and photographing frame 2 are subjected to addition processing. For example, with the example that was shown in FIG. 6, if R'1L that was read out in an odd-numbered frame and R'1R that was read out in an even-numbered frame are subjected to addition processing, left side pixel addition values and right side pixel addition values are added, resulting in appropriate pixel values as a taken image. After that, photographing frame 2 and photographing frame 3 are added, photographing frame 3 and photographing frame 4 are added, and this addition processing is repeated.

By using a method of subjecting associated pixel addition values for corresponding pixel positions to addition processing for adjacent photographing frames that have been taken continuously in this way, low power consumption and high frame rate become possible, and it is possible to provide a system that is also capable of phase difference AF, and through image display and movie recording.

Next, a modified example of the pixel addition of this embodiment will be described using FIG. 10. The pixel addition that was shown in FIG. 5A and FIG. 5B was performed using horizontal 1/3 thinning and vertical 3/3 addition. Conversely, with this modified example the horizontal direction is a 2/3 mix method. Specifically, among three pixel columns in the horizontal direction, in two of those columns addition values for pixel values are calculated for each column. It should be noted that a pixel column here is one column that is a combination of column x1 and column x2. The same applies to other columns.

With the example shown in FIG. 5A, among R pixels in an odd-numbered frame pixel values for R1L, R2L and R3L were added. However, with this modified example an addition value for six pixels that have been designated within a dotted line in FIG. 10, specifically, R4L, R5L and R6L, in addition to R1L, R2L and R3L, to give a total of 6 left side pixel values, is calculated. Addition values are similarly calculated for other pixel values. Also, in even-numbered frames, an addition value for six pixels that have been designated within a dotted line in FIG. 10, specifically, R4R, R5R and R6R, in addition to R1R, R2R and R3R, to give a total of 6 right side pixel values, is calculated. Addition values are similarly calculated for other pixel values.

Since this modified example has an increased number of pixels that are processed compared to the horizontal 1/3 thinning and vertical 3/3 addition that was shown in FIG. 5A and FIG. 5B, although processing time and power are increased, precision of focus detection is improved.

Next, modified example of division of photo diodes (PD) will be described using FIG. 11. With the above described first embodiment, description was given of an example where a single microlens is divided into two, left and right. However, for a structure where four pixels are arranged for a single microlens also (4PD structure (refer to FIG. 3)), by adding pixel values of two pixels, as shown in FIG. 11, it can be considered in the same way as the 2PD structure described above. With both adding two pixels vertically, and adding two left and right pixels it is possible to handle the above described embodiment.

For example in FIG. 11 R1UL is an R pixel that has been arranged at the upper left, and R1DL is an R pixel that has been arranged at the lower left. By adding pixel values of both of these pixels they can be handled as a left side R pixel. Also, R1UR is an R pixel that has been arranged at the upper, and R1DR is an R pixel that has been arranged at the lower right. By adding pixel values of both of these pixels they can be handled as a right side R pixel.

Also, in FIG. 11, B1UL is a B pixel that has been arranged at the upper left and B1UR is a B pixel that has been arranged at the upper right, and by adding pixel values of both of these pixels they can be handled as an upper B pixel. Also, B1DL is a B pixel that has been arranged at the lower left and B1DR is a B pixel that has been arranged at the lower right. By adding pixel values of both of these pixels they can be handled as a lower B pixel. It should be noted that pixel readout for a case where a photodiode (PD) has been divided vertically will be described later using FIG. 12A and FIG. 12B.

Next, a second embodiment of the present invention will be described using FIG. 12A, and FIG. 12B. In the first embodiment of the present invention description was given of an example where a photodiode was divided into left and right. However, this is not limiting, and a photodiode may be divided into two vertically, and pixel values of an upper pixel or a lower pixel read out. Circuit structures etc. of this embodiment are the same as those of FIG. 1 that showed the first embodiment, and so detailed description is omitted. Pixel readout and pixel addition of this embodiment will be described using FIG. 12A and FIG. 12B.

FIG. 12A is a drawing showing pixel readout and pixel addition for odd-numbered frames. In FIG. 12A, pixel R1T which is at position (x1, y1T) in row y1T is an upper R pixel, pixel R2T which is at position (x3, y1T) is an upper R pixel, and pixel R3T which is at position (x5, y1T) is an upper R pixel. Pixel values of these three upper R pixels are added. Specifically, in this embodiment the first pixel section and the second pixel section are paired in a direction that is orthogonal to the row direction.

Similarly, pixel R7B which is at a position (x1, y7B) in row y7B is a lower R pixel, pixel R8B which is at position (x3, y7B) is a lower R pixel, and pixel R9B which is at position (x5, y7B) is a lower R pixel. Pixel values of these three lower R pixels are added. By obtaining addition values for other upper R pixels and lower R pixels, it is possible to calculate the phase difference for R pixels. Similarly, upper pixel values and lower pixel values are also calculated for B pixels, Gr pixels and Gb pixels, and it is possible to calculate phase difference. Also, a phase difference is calculated between the pair values of upper G pixels Gr1T, Gr2T and Gr3T, and lower G pixels Gb1B, Gb2B, and Gb3B. In this way, it is possible to detect phase difference with a higher precision using pixel addition values that are spatially closer than pairs of R pixels and B pixels.

FIG. 12B is a drawing showing pixel readout and pixel addition for even-numbered frames. R1B which is at a position (x1, y1B) in row y1B is a lower R pixel, R2B which is at position (x3, y1B) is a lower R pixel, and R3B which is at position (x5, y1B) is a lower R pixel. Pixel values of these three lower R pixels are added.

Similarly, R7T which is at position (x1, y7T) in row y7T is an upper R pixel, R8T which is at position (x3, y7T) is an upper R pixel, and R9T which is at position (x5, y7T) is an upper R pixel. Pixel values of these three upper R pixels are added. For even-numbered frames also, by obtaining addition values for other upper R pixels and lower R pixels, it is possible to calculate the phase difference for R pixels. Similarly, upper pixel values and lower pixel values are also calculated for B pixels, Gr pixels and Gb pixels, and it is possible to calculate phase difference. Also, phase difference is calculated by pairing addition values for lower G pixels Gr1B, Gr2B and Gr3B, and addition values for upper G pixels Gb1T, Gb2T, and Gb3T. In this way, it is possible to detect phase difference with a higher precision using pixel addition values that are spatially closer than pairs of R pixels and B pixels.

Next, a third embodiment of the present invention will be described. With the first embodiment and the second embodiment, in frame addition processing when creating a through image and a movie image, in a case where a subject is moving quickly with respect to frame rate there is a possibility of subject blurring becoming larger as a result of frame addition processing. In order to prevent the effects of blurring, the following processing is performed.

As was shown in FIG. 9, when performing addition processing for each frame, whether or not there is an in-focus pixel is determined using phase difference detection results, and in-focus pixels have pixel values of that frame doubled without performing frame addition. Pixels that are in focus have the same pixel value for right side pixels and left side pixels, which means that it is possible to obtain an appropriate image by doubling pixel values for a single frame, without calculating pixel values for two frames for every respective pixel position, that is, without calculating pixel values pairs for phase difference. By performing this image processing, it is possible to prevent increasing subject blur that arises when frame addition is performed.

Specifically, at the time of frame addition, for pixels that are not in focus a left side pixel signal (R1L) for a first column (for example, column x1L) of an odd-numbered frame, and a right side pixel signal (R1R) of a first column (for example, column x1R) of an even-numbered frame, are added. Also, a right side pixel signal (Gr1R) for a second column (for example, column x2R) of an odd-numbered frame, and a left side pixel signal (Gr1L) of a second column (for example, column x2L) of an even-numbered frame, are added Conversely, pixels that are in focus use values resulting from doubling a left-side pixel signal (R1L) of a first column (for example, column x1L) of an odd-numbered frame, and use values resulting from doubling a right-side pixel signal (Gr1R) of a second column (for example, column x2R) of an odd-numbered frame. This processing does not have be applied to odd-numbered frames, and may also be applied to even-numbered frames. Also, for frames before and after two images (frames) that are added also, similarly, pixel signals may be doubled.

With images within the same frame, pixels that are not in focus require frame addition, and so subject blur becomes large. However, since there are portions that are not in focus in the first place, the extent of subject blur does not affect image quality. Therefore, at the time of frame addition, it is determined whether there is a pixel that is in focus using phase difference detection results, and pixels that are in focus have a pixel value doubled without addition. There are situations in which this will achieve sufficient image quality.

As has been described above, with each of the embodiments and modified examples of the present invention, in a first frame among a plurality of image frames (for example, the odd-numbered frames) a first pixel addition signal (for example, Gb'1L in FIG. 6) is generated by adding pixel signals (for example, Gb1L, Gb2L, Gb3L) of the first pixel section corresponding to a first column (for example, x1 in FIG. 5A) of a microlens in a column direction, and a second pixel addition signal (for example, Gr'1R in FIG. 6) is generated by adding pixel signals (for example, Gr1R, Gr2R, Gr3R) of a second pixel section corresponding to a second column (for example, column x2 in FIG. 5), that is different from the first column, in a column direction, and the first pixel addition signal and the second pixel addition signal are respectively output, and in a second frame that is continuous to the first frame (for example, the even-numbered frames) a third pixel addition signal (for example, Gb'1R in FIG. 6) is generated by adding outputs (for example, Gb1R, Gb2R, Gb23) of the second pixel section corresponding to a first column in a column direction and a fourth pixel addition signal (for example, Gr'1L in FIG. 6) is generated by adding outputs (for example, Gr1L, Gr2L, Gr3L) of the first pixel section corresponding to the second column, in a column direction, and the third pixel addition signal and the fourth pixel addition signal are respectively output. As a result it is possible to provide pixel additional signals for phase difference AF with a simple structure, and it is possible to generate data for image generation from these pixel signal for phase difference AF.

Also, with each of the embodiments and modified examples of the present invention, for pixels of adjacent columns within the image sensor phase difference AF is performed using added pixel signals of the same color in the column direction. Specifically, for the purpose of phase difference detection two pixels (photodiodes (PD)) are arranged, so as to form pairs corresponding to each microlens. Also, color filters for any of R, G and B are arranged in correspondence with each microlens, and R pixel signals, G pixel signals and B pixel signals are output from respective pixels. A phase difference AF is performed using, as a pair, column directional added pixel signals of adjacent columns which are the same color within each RGB pixel column (refer to FIG. 5A and FIG. 6). In one photographing frame only one signal from either a left side pixel or a right side pixel is output from the RGB pixels, but by adopting this structure since added pixel signals that are paired at different sides in adjacent columns in the column direction are output it becomes possible to perform phase difference detection with the added pixels signals paired for the same color in a single photographing frame being used.

Also, with each of the embodiments and modified examples of the present invention, in the case of outputs of PDs that have been divided into two, division direction (pairing direction) for addition in each column is changed, and further, PD outputs of a different side (either side of a pair) are combined in alternate frames. Specifically, for example, for each column it is made different in that either a pixel signal of a left side pixel or a pixel signal of a right side pixel is output within two divisions. Further, division direction for adding in each column is changed in accordance with whether a photographing frame is an odd-numbered frame or an even-numbered frame. For example, for added pixels signals containing the same pixels, in a case where an added pixel signal for left side pixels has been output in an odd-numbered frame, in an even-numbered frame an added pixel signal for right side pixels is output (refer to FIG. 5A and FIG. 5B).

Also, with each of the embodiments and modified examples of the present invention, a through image/movie image is created, and displayed/stored, by combining images of two continuous photographing frames. Specifically, for each frame a division direction (pairing direction) for adding in each column is alternately changed. Then, pixel signals for corresponding pixel positions in odd-numbered frames and even-numbered frames are added, and a through image/movie image is generated (refer to FIG. 9). This means that if there are pixel signals of two photographing frames left side pixels and right side pixels are added, and it is possible to obtain appropriate image data that is not subjected to the effects of pupil-division for RGB pixels.

Also, with each of the embodiments and modified examples of the present invention, when creating a through image/movie image by combining images of two photographing frames, addition of pixel signals is not performed for pixels that are in focus. Specifically, it is possible to determine whether or not a pixel is in focus using phase difference AF, and whether or not addition of two pixel signals will be performed is determined based on the result of this in focus determination. In the event that addition of pixel signals is not performed, a single pixel signal may be doubled. This means that it is possible to make subject blur inconspicuous even in the case where the subject moves between two photographing frames etc.

It should be noted that with each of the embodiments and modified examples of the present invention, an addition direction for pixel signals has been described with a vertical direction of the image sensor as the column direction. However, the column direction is not limited to the vertical direction and may also be made the horizontal direction. Also, with each of the embodiments and modified examples of the present invention, pixel signals for three pixels in the column direction are added, but the number of additions is not limited to three pixels and may be another numerical value, and may be a single pixel (in this case, addition computation can be effectively omitted). Also, with each of the embodiments and modified examples of the present invention, divided PDs for phase difference detection are arranged on the entire image plane of the image sensor 107. However, this is not limiting, and divided PDs for phase difference detection may also be arranged in required areas, such as in regions of ranging areas. It should be noted that in each of the embodiments and modified examples of the present invention description has been given for movie recording, but the present invention may also be applied to still picture recording.

Also, in each of the embodiments and modified examples of the present invention, some or all of the AE circuit 108, AF circuit 109, image processing circuit 110, nonvolatile memory 113, built-in memory 114, compression and expansion circuit 115 etc. may also be integrated with the CPU 117 and CPU peripheral circuits. It is also possible for the AE circuit 108, AF circuit 109, image processing circuit 110, compression and expansion circuit 115 etc. to have a hardware structure such as gate circuits that have been generated based on a programming language that is described using Verilog, and also to use a hardware structure that utilizes software such as a DSP (digital signal processor). Suitable combinations of these approaches may also be used. The use of a CPU is also not limiting as long as elements fulfill a function as a controller.

Also, with this embodiment, an instrument for taking pictures has been described using a digital camera, but as a camera it is also possible to use a digital single lens reflex camera or a compact digital camera, or a camera for movie use such as a video camera, and further to have a camera that is incorporated into a mobile phone, a smartphone, a mobile information terminal, personal computer (PC), tablet type computer, game console etc., a medical camera, or a camera for a scientific instrument such as a microscope, a camera for mounting on a vehicle, a surveillance camera etc. In any event, it is possible to adopt the present invention as long as a device utilizes phase difference AF. The present invention may be adopted in an endoscope etc. as a medical camera. By applying to an insertion section of an endoscope, in the middle of moving the insertion part inside an object under examination into which the insertion part has been inserted, phase difference AF is executed, and it is possible to perform observation image display, still picture shooting continuous shooting, and movie shooting that is in focus.

Also, among the technology that has been described in this specification, with respect to control that has been described mainly using flowcharts, there are many instances where setting is possible using programs, and such programs may be held in a storage medium or storage section. The manner of storing the programs in the storage medium or storage section may be to store at the time of manufacture, or by using a distributed storage medium, or they be downloaded via the Internet.

Also, with the one embodiment of the present invention, operation of this embodiment was described using flowcharts, but procedures and order may be changed, some steps may be omitted, steps may be added, and further the specific processing content within each step may be altered. It is also possible to suitably combine structural elements from different embodiments.

Also, regarding the operation flow in the patent claims, the specification and the drawings, for the sake of convenience description has been given using words representing sequence, such as "first" and "next", but at places where it is not particularly described, this does not mean that implementation must be in this order.

As understood by those having ordinary skill in the art, as used in this application, 'section,' 'unit,' 'component,' 'element,' 'module,' 'device,' 'member,' 'mechanism,' 'apparatus,' 'machine,' or 'system' may be implemented as circuitry, such as integrated circuits, application specific circuits ("ASICs"), field programmable logic arrays ("FPLAs"), etc., and/or software implemented on a processor, such as a microprocessor.

The present invention is not limited to these embodiments, and structural elements may be modified in actual implementation within the scope of the gist of the embodiments. It is also possible form various inventions by suitably combining the plurality structural elements disclosed in the above described embodiments. For example, it is possible to omit some of the structural elements shown in the embodiments. It is also possible to suitably combine structural elements from different embodiments.

What is claimed is:

1. An image sensor, comprising:
   pixels arranged two-dimensionally in a matrix, each of the pixels having a micro-lens, a first photoelectric conversion section and a second photoelectric conversion section, wherein the first and second photoelectric conversion sections define a pupil-division pair that are arranged in correspondence with the micro-lens, and
   a pixel signal generation circuit that repeatedly outputs a processed readout image frame, wherein each of the processed readout image frames is made up of pixel signals, wherein each of the pixel signals is a result of addition of signals of a plurality of the first photoelectric conversion sections, or a result of addition of signals of a plurality of the second photoelectric conversion sections, wherein the pixel signal generation circuit
   adds, in a first frame among a plurality of image frames, signals of the first photoelectric conversion sections corresponding to a first column of the micro-lenses in a column direction to generate a first pixel signal,
   adds, in the first frame among the plurality of image frames, pixel signals of the second photoelectric conversion sections corresponding to a second column of the micro-lenses that is different to the first column of the micro-lenses, in a column direction to generate a second pixel signal,
   respectively outputs the first and second pixel signals,
   adds, in a second frame that is continuous to the first frame, signals of the second photoelectric conversion section corresponding to the first column of the micro-lenses in a column direction to generate a third pixel signal,
   adds, in the second frame that is continuous to the first frame, signals of the first photoelectric conversion section corresponding to the second column of the micro-lenses in a column direction to generate a fourth pixel addition signal, and
   respectively outputs the third and fourth pixel signals.

2. The image sensor of claim 1, wherein:
   the first column of the micro-lenses and the second column of the micro-lenses are adjacent, and the pixel signal generation circuit generates a pixel signal by adding signals of first and second photoelectric conversion sections of adjacent first and second columns of the micro-lenses, in the column direction.

3. The image sensor of claim 1, further comprising:
   a plurality of color filters respectively corresponding to the plurality of micro-lenses, and wherein
   the pixel signal generation circuit generates a first pixel signal by, in the plurality of image frames, adding signals corresponding to color filters of the same color, among signals of the first photoelectric conversion section corresponding to the first column of the micro-lenses, in the column direction, and generates a second pixel signal by adding signals corresponding to color filters of the same color, among signals of the second photoelectric conversion section corresponding to the second column of the micro-lenses, in the column direction.

4. The image sensor of claim 1, wherein:
   the first photoelectric conversion section and the second photoelectric conversion section are paired in the column direction.

5. The image sensor of claim 1, wherein:
   the first photoelectric conversion section and the second photoelectric conversion section are paired in a direction orthogonal to the column direction.

6. An imaging device comprising the image sensor of claim 1, and further comprising:
   a phase difference detection circuit that is input with first, second, third and fourth pixel signals from the image sensor and performs phase difference detection, wherein
   the phase difference detection circuit performs phase difference detection based on the first pixel signal and the second pixel signal, or performs phase difference detection based on the third pixel signal and the fourth pixel signal.

7. The imaging device of claim 6, further comprising:
   a processor that is input with signals output from the image sensor, and that generates image data for display or storage, wherein
   the processor adds a first signal and fourth signal, and adds a second signal and third signal, to generate image data for display or storage.

8. The imaging device of claim 7, wherein:
the phase difference detection circuit determines in-focus portions and non-focus portions within an image frame using phase difference detection based on signals of the image frame, and
in portions that have been determined to be in-focus, the processor generates image data for display or storage by correcting the first pixel signal and the second pixel signal, or correcting the third pixel signal and the fourth pixel signal, without performing addition of the first pixel signal and the fourth pixel signal, and without performing addition of the second pixel signal and the third pixel signal.

9. An imaging method for an imaging device that is provided with pixels arranged two-dimensionally in a matrix, each of the pixels having a micro-lens, a first photoelectric conversion section and a second photoelectric conversion section, wherein the first and second photoelectric conversion sections define a pupil-division pair that are arranged in correspondence with the micro-lens, the imaging method comprising:
repeatedly outputting a processed readout image frame, wherein each of the processed output image frames is made up of pixel signals, wherein each of the pixel signals is a result of addition of signals of a plurality of the first photoelectric conversion sections, or a result of addition of signals of a plurality of the second photoelectric conversion sections;
adding, in a first frame among a plurality of image frames, signals of the first photoelectric conversion sections corresponding to a first column of the micro-lenses in a column direction to generate a first pixel signal;
adding, in the first frame among a plurality of image frames, signals of the second photoelectric conversion sections corresponding to a second column of the micro-lenses that is different to the first column of the micro-lenses in a column direction to generate a second pixel signal;
respectively outputting the first and second pixel signals;
adding, in a second frame that is continuous to the first frame, signals of the second photoelectric conversion section corresponding to the first column of the micro-lenses in a column direction to generate a third pixel signal;
adding, in the second frame that is continuous to the first frame, signals of the first photoelectric conversion section corresponding to the second column of the micro-lenses in a column direction to generate a fourth pixel signal; and
respectively outputting the third and fourth pixel signals.

10. The imaging method of claim 9, wherein the first column of the micro-lenses and the second column of the micro-lenses are adjacent columns, the imaging method further comprising:
generating a pixel signal by adding signals of the first and second photoelectric conversion sections of the first and second columns of the micro-lenses in a column direction.

11. The imaging method of claim 9, wherein the pixels have a plurality of color filters of a plurality of colors respectively corresponding to the plurality of micro-lenses, the imaging method further comprising:
generating, in the plurality of processed readout image frames, a first pixel signal by adding signals corresponding to color filters of the same color, among signals of the first photoelectric conversion section corresponding to the first column of the micro-lenses, in the column direction, and generating a second pixel signal by adding signals corresponding to color filters of the same color, among signals of the second photoelectric conversion section corresponding to the second column of the micro-lenses, in the column direction.

12. The imaging method of claim 9, further comprising:
performing phase difference detection based on the first pixel signal and the second pixel signal, or performing phase difference detection based on the third pixel signal and the fourth pixel signal.

13. The imaging method of claim 12, wherein the first photoelectric conversion section and the second photoelectric conversion section are paired in the column direction, the method further comprising:
performing phase difference detection for the column direction.

14. The imaging method of claim 12, wherein the first photoelectric conversion section and the second photoelectric conversion section are paired in a direction orthogonal to the column direction, the method further comprising:
performing phase difference detection for a direction orthogonal to the column direction.

15. The imaging method of claim 12, further comprising:
adding a first signal and fourth signal, and adding a second signal and third signal, to generate image data for display or storage.

16. A non-transitory computer-readable medium storing a processor executable code, which when executed by at least one processor, performs an imaging method, the processor being provided in an imaging device, and the imaging device being provided with pixels arranged two-dimensionally in a matrix, each of the pixels having a micro-lens, a first photoelectric conversion section and a second photoelectric conversion section, wherein the first and second photoelectric conversion sections define a pupil-division pair that are arranged in correspondence with the micro-lens, the imaging method comprising:
repeatedly outputting a processed readout image frame, wherein each of the processed output image frames is made up of pixel signals, wherein each of the pixel signals is a result of addition of signals of a plurality of the first photoelectric conversion sections, or a result of addition of signals of a plurality of the second photoelectric conversion sections;
adding, in a first frame among a plurality of image frames, signals of the first photoelectric conversion sections corresponding to a first column of the micro-lenses in a column direction to generate a first pixel signal;
adding, in the first frame among a plurality of image frames, signals of the second photoelectric conversion sections corresponding to a second column of the micro-lenses that is different to the first column of the micro-lenses in a column direction to generate a second pixel signal;
respectively outputting the first and second pixel signals;
adding, in a second frame that is continuous to the first frame, signals of the second photoelectric conversion section corresponding to the first column of the micro-lenses in a column direction to generate a third pixel signal;
adding, in the second frame that is continuous to the first frame, signals of the first photoelectric conversion section corresponding to the second column of the micro-lenses in a column direction to generate a fourth pixel signal; and
respectively outputting the third and fourth pixel signals.

17. The non-transitory computer-readable medium of claim 16, the imaging method wherein the first column of the micro-lenses and the second column of the micro-lenses are adjacent columns, the imaging method further comprising:

generating a pixel signal by adding signals of the first and second photoelectric conversion sections of the first and second columns of the micro-lenses in a column direction.

18. The non-transitory computer-readable medium of claim 16, wherein the pixels within the imaging device have a plurality of color filters of a plurality of colors respectively corresponding to the plurality of micro-lenses, the imaging method further comprising:

generating, in the plurality of processed readout image frames, a first pixel signal by adding signals corresponding to color filters of the same color, among signals of the first photoelectric conversion section corresponding to the first column of the micro-lenses, in the column direction, and generating a second pixel signal by adding signals corresponding to color filters of the same color, among signals of the second photoelectric conversion section corresponding to the second column of the micro-lenses, in the column direction.

19. The non-transitory computer-readable medium of claim 16, the imaging method further comprises:

performing phase difference detection based on the first pixel signal and the second pixel signal, or performing phase difference detection based on the third pixel signal and the fourth pixel signal.

20. The non-transitory computer-readable medium of claim 19, the imaging method further comprises:

adding a first signal and fourth signal, and adding a second signal and third signal, to generate image data for display or storage.

* * * * *